US010903387B2

United States Patent
Lin

(10) Patent No.: US 10,903,387 B2
(45) Date of Patent: Jan. 26, 2021

(54) OPTICAL SENSING ASSEMBLY AND METHOD FOR MANUFACTURING THE SAME, AND OPTICAL SENSING SYSTEM

(71) Applicant: SILERGY SEMICONDUCTOR TECHNOLOGY (HANGZHOU) LTD, Zhejiang (CN)

(72) Inventor: Suyi Lin, Zhejiang (CN)

(73) Assignee: SILERGY SEMICONDUCTOR TECHNOLOGY (HANGZHOU) LTD, Zhejiang (CN)

( * ) Notice: Subject to any disclaimer, the term of this patent is extended or adjusted under 35 U.S.C. 154(b) by 0 days.

(21) Appl. No.: 16/265,885

(22) Filed: Feb. 1, 2019

(65) Prior Publication Data

US 2019/0363216 A1    Nov. 28, 2019

(30) Foreign Application Priority Data

May 25, 2018 (CN) .......................... 2018 1 0515203

(51) Int. Cl.
*H01L 31/16* (2006.01)
*G01S 17/08* (2006.01)
*G01S 17/04* (2020.01)

(52) U.S. Cl.
CPC .............. *H01L 31/16* (2013.01); *G01S 17/04* (2020.01); *G01S 17/08* (2013.01)

(58) Field of Classification Search
CPC ................. H01L 31/16; H01L 31/0203; H01L 33/52–56; G01S 17/04–08; G02B 6/42
See application file for complete search history.

(56) References Cited

U.S. PATENT DOCUMENTS

| | | | | |
|---|---|---|---|---|
| 7,755,029 B2* | 7/2010 | Tang | ..................... | G06F 3/0317 250/221 |
| 9,733,357 B2* | 8/2017 | Costello | ................ | G01S 7/4813 |
| 2010/0259766 A1* | 10/2010 | Wiese | ................... | H01L 25/167 356/614 |
| 2015/0212208 A1* | 7/2015 | Hanada | ............... | H01L 31/0203 250/221 |
| 2016/0377762 A1* | 12/2016 | Uedaira | .................. | G01V 8/12 250/221 |
| 2018/0143346 A1* | 5/2018 | Wang | ................... | G06F 3/0304 |

* cited by examiner

*Primary Examiner* — Steven Whitesell Gordon
(74) *Attorney, Agent, or Firm* — Harness, Dickey & Pierce, P.L.C.

(57) ABSTRACT

There are provided an optical sensing assembly, a method for manufacturing an optical sensing assembly, and an optical sensing system. In the optical sensing assembly, a light emitting surface of a light emitting element is arranged in nonparallel to a light receiving surface of a light sensing element. Further, the optical sensing system is formed by the optical sensing assembly and a light guide assembly. Therefore, a distance between light emitted by the light emitting element to a to-be-detected object and light received by the light sensing element is increased, so that optical crosstalk can be greatly suppressed even if the optical sensing assembly has a small size, thereby improving distance detection accuracy.

19 Claims, 4 Drawing Sheets

OPTICAL SENSING ASSEMBLY AND METHOD FOR MANUFACTURING THE SAME, AND OPTICAL SENSING SYSTEM

CROSS REFERENCE OF RELATED APPLICATION

This application claims the priority to Chinese Patent Application No. 201810515203.2, titled "OPTICAL SENSING ASSEMBLY AND METHOD FOR MANUFACTURING THE SAME, AND OPTICAL SENSING SYSTEM", filed on May 25, 2018 with the Chinese Patent Office, which is incorporated herein by reference in its entirety.

FIELD

The present disclosure relates to the technical field of semiconductor devices, and in particular to an optical sensing assembly, a method for manufacturing an optical sensing assembly, and an optical sensing system.

BACKGROUND

The proximity detection is a technology in which proximity of an object is detected under non-contact conditions, and is widely applied in fields such as industrial automatic control, Internet of Things technology, and electronic games. Depending on different detection principles, the proximity detection may be implemented by different sensors including a capacitive sensor, an inductive sensor and a photoelectric sensor. The operation principle of the photoelectric sensor is that, the object is illuminated with light emitted by a light source, and the light reflected by the object is received and converted into an electrical signal by a photoelectric sensing device. The proximity detection of the photoelectric sensor is suitable for various daily applications. For example, the photoelectric sensor may be used in a mobile phone to detect talking posture of a user, and the photoelectric sensor may also be used in a virtual reality (VR) device and a smart watch to detect a device worn by a user.

FIG. 1 is a sectional view of an optical sensing assembly in the conventional technology. The optical sensing assembly 100 includes a substrate 101, a light shielding cover 105 secured to the substrate 101, a light emitting element 102, a photoelectric conversion circuit 103, and a transparent covering layer 109 and a shielding layer 108 which are located above the substrate 101. Chambers respectively for accommodating the light emitting element 102 and the photoelectric conversion circuit 103 are formed by the light shielding cover 105. A light emitting opening 107 and a light receiving opening 106 are formed at the top of the chambers. The transparent covering layer 109 and the shielding layer 108 together form a cover plate and define an opening 112. The light generated by the light emitting element 102 as a light source is emitted to the object 110 via the light emitting opening 107 and the opening 112. The photoelectric conversion circuit 103 includes a light sensing element 104. The photoelectric conversion circuit 103 receives the light reflected by the object via the opening 112 and the light receiving opening 106, and the light sensing element 104 converts the reflected light into an electrical signal.

In the optical sensing assembly 100, the light emitting element 102 and the photoelectric conversion circuit 103 are integrated in a same encapsulating assembly, and the light shielding cover 105 is further configured to serve as a separator plate separating the light emitting path from the light reflecting path, so that the size of the optical sensing assembly can be decreased. In a case that the optical sensing assembly 100 is applied in an electronic device such as a mobile phone, the size of the electronic device can be further deceased. However, the surface of the transparent covering layer 109 will cause reflection of the light is in mediums having different refractive indexes, as indicated by dashed lines in FIG. 1. Further, the light reflected by the surface of the transparent covering layer 109 may reach the light sensing element 104 via the receiving opening 112, and optical crosstalk may be caused, which results in a misjudgment of the distance from the object 110 to the optical sensing assembly 100.

In some improved optical sensing assemblies, the optical crosstalk is decreased by increasing the distance between the light emitting element and the light sensing element. In this case, the emission intensity of the light emitting element is required to be enhanced, and the assembly has an increased cost or an increased volume.

SUMMARY

In view of this, an optical sensing assembly is provided in the present disclosure, to decrease optical crosstalk by arranging a light emitting surface in nonparallel to a light receiving surface.

An optical sensing assembly is provided according to a first aspect of the present disclosure. The optical sensing assembly includes: a light emitting element, a first structure encapsulating the light emitting element, a light sensing element, and a second structure encapsulating the light sensing element, where a light emitting surface is provided on a surface of the first structure; a light receiving surface is provided on a surface of the second structure; a light is emitted by the light emitting element to outside of the optical sensing assembly via the light emitting surface and is reflected by a to-be-detected object; the light reflected by the to-be-detected object is received by the light sensing element via the light receiving surface, the light sensing element is configured to perform distance sensing on the to-be-detected object based on the received reflected light; and the light emitting surface is not parallel to the light receiving surface.

In an embodiment, the first structure and the second structure are arranged side by side. The light receiving surface is located on a top surface of the second structure, where the top surface of the second structure is located above an active surface of the light sensing element. The light emitting surface is located on at least one of other side surfaces of the first structure than a side surface of the first structure adjacent to the second structure, where side surfaces of the first structure are surfaces of the first structure adjacent to a top surface of the first structure, and the top surface of the first structure is located above an active surface of the light emitting element.

In an embodiment, the first structure includes a first light shielding cover. The first light shielding cover includes a first portion covering the top surface of the first structure and a second portion covering the side surface of the first structure adjacent to the second structure.

In an embodiment, an inclined surface or a curved surface is formed at a section of an inner surface of the first portion of the first light shielding cover intersecting an inner surface of the second portion of the first light shielding cover, and the inner surface of the first light shielding cover is a surface of the first light shielding cover close to the light emitting element.

In an embodiment, a light blocking layer is arranged on at least one of an outer surface of the second portion of the first light shielding cover and an outer surface of the first portion of the first light shielding cover, and the outer surface of the second portion of the first light shielding cover is a surface of the second portion of the first light shielding cover adjacent to the second structure.

In an embodiment, at least one of the outer surface of the second portion of the first light shielding cover and the outer surface of the first portion of the first light shielding cover is painted black.

In an embodiment, an angle between the light emitting surface and the light receiving surface is greater than or equal to 90 degrees.

In an embodiment, the first structure further includes a first transparent body covering the light emitting element, and the first light shielding cover covers a part of surfaces of the first transparent body.

In an embodiment, the second structure includes a second transparent body covering the light sensing element.

In an embodiment, the first portion of the first light shielding cover extends to a part of the top surface of the second structure. The second structure includes a second light shielding cover. The second light shielding cover covers a part of the top surface of the second structure and at least a part of side surfaces of the second structure, with the light receiving surface being located in a region formed between the first portion of the first light shielding cover and the second light shielding cover.

In an embodiment, the light sensing element includes: a light receiving element configured to receive the light reflected by the to-be-detected object; and a photoelectric conversion circuit configured to convert the reflected light into an electrical signal to be outputted.

In an embodiment, at least one light emitting element and at least one light sensing element are encapsulated in an encapsulating body, and the encapsulating body includes the first structure and the second structure.

In an embodiment, the optical sensing assembly further includes a circuit substrate, the light emitting element and the light sensing element are respectively located on a first region and a second region of the circuit substrate;

the first structure covers the first region to encapsulate the light emitting element together with the first region; and the second structure covers the second region to encapsulate the light sensing element together with the second region.

In an embodiment, the first light shielding cover is configured to reflect the light emitted by the light emitting element.

A method for manufacturing an optical sensing assembly is provided according to a second aspect of the present disclosure. The method includes:

encapsulating a light emitting element in a first structure, where a light emitting surface is provided on a surface of the first structure; and encapsulating a light sensing element in a second structure, where a light receiving surface is provided on a surface of the second structure, where a light is emitted by the light emitting element to outside of the optical sensing assembly via the light emitting surface and is reflected by a to-be-detected object, the light reflected by the to-be-detected object is received by the light sensing element via the light receiving surface, and the light sensing element is configured to perform distance sensing on the to-be-detected object based on the received reflected light; and the light emitting surface is arranged in nonparallel to the light receiving surface.

In an embodiment, the method further includes:

arranging the first structure and the second structure side by side;

arranging the light receiving surface on a top surface of the second structure, where the top surface of the second structure is located above an active surface of the light sensing element; and arranging the light emitting surface on at least one of other side surfaces of the first structure than a side surface of the first structure adjacent to the second structure, where side surfaces of the first structure are surfaces of the first structure adjacent to a top surface of the first structure, and the top surface of the first structure is located above an active surface of the light emitting element.

In an embodiment, the method further includes:

arranging at least one light emitting element and at least one light sensing element in an encapsulating body, where the encapsulating body includes the first structure and the second structure.

In an embodiment, the step of arranging at least one light emitting element and at least one light sensing element in an encapsulating body includes:

providing a circuit substrate;

installing the at least one light emitting element in a first region of the circuit substrate in a manner in which the active surface of the light emitting element faces up, and installing the at least one light sensing element in a second region of the circuit substrate in a manner in which the active surface of the light sensing element faces up; and covering the first region with the first structure and covering the second region with the second structure.

In an embodiment, the step of covering the first region with the first structure and covering the second region with the second structure includes:

providing a first light shielding cover for the light emitting element on the circuit substrate, where the first light shielding cover includes: a first portion located above the active surface of the light emitting element, and a second portion located between the first region and the second region and connected with the first portion; and filling a space between the first light shielding cover and the light emitting element with a transparent encapsulant, to form a first transparent body covering the light emitting element and a second transparent body covering the light sensing element, where the first structure includes the first light shielding cover and the first transparent body, and the second structure includes the second transparent body.

In an embodiment, the method further includes: forming an inclined surface or a curved surface at a section of an inner surface of the first portion of the first light shielding cover intersecting an inner surface of the second portion of the first light shielding cover, where the inner surface of the first light shielding cover is a surface of the first light shielding cover close to the light emitting element.

In an embodiment, the method further includes: painting at least one of an outer surface of the second portion of the first light shielding cover and an outer surface of the first portion of the first light shielding cover black, where the outer surface of the second portion of the first light shielding cover is a surface of the second portion of the first light shielding cover adjacent to the second structure.

An optical sensing system is provided according to a third aspect of the present disclosure. The optical sensing system includes the optical sensing assembly described above and a light guide assembly arranged adjacent to the light emitting surface of the optical sensing assembly, where a light is transmitted to the light guide assembly via the light emitting surface, and the light transmitted to the light guide assembly is transmitted to the to-be-detected object via a first surface of the light guide assembly and is reflected by the to-be-detected object; and the first surface is parallel to the light receiving surface.

In an embodiment, the light guide assembly further includes: a second surface opposite to the first surface, where a light guide structure is provided on the second surface to guide the light entering in the light guide assembly to be emitted from the first surface.

In an embodiment, the light guide structure is made of a diffusion material adhered to the second surface of the light guide assembly.

In an embodiment, the light guide structure is a micro structure.

There are provided an optical sensing assembly, a method for manufacturing an optical sensing assembly, and an optical sensing system in the present disclosure. In the optical sensing assembly, a light emitting surface of a light emitting element is arranged in nonparallel to a light receiving surface of a light sensing element. Further, the optical sensing system is formed by the optical sensing assembly and a light guide assembly. Therefore, a distance between light emitted by the light emitting element to a to-be-detected object and light received by the light sensing element is increased, so that optical crosstalk can be greatly decreased even if the optical sensing assembly has a small size, thereby distance detection accuracy is improved.

BRIEF DESCRIPTION OF THE DRAWINGS

The above and other objects, features and advantages of the present disclosure are apparent from the following description given in conjunction with the drawings.

DETAILED DESCRIPTION OF EMBODIMENTS

Figure 1:
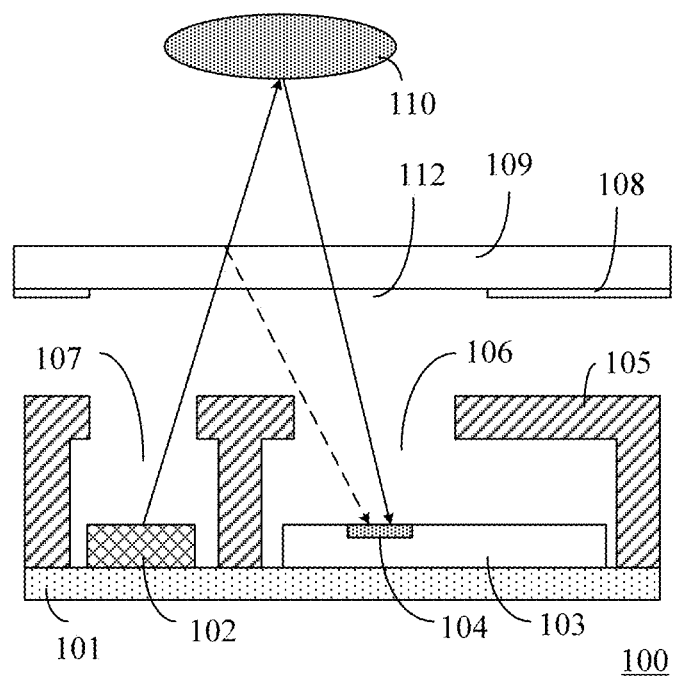
FIG. 1 is a sectional view of an optical sensing assembly in the conventional technology.

The present disclosure is described in detail with reference to the drawings. In the drawings, the same component is indicated by similar reference numerals. For the sake of clarity, the drawings are not drawn to scale, and some well-known portions may not be shown. For the sake of brevity, a semiconductor structure obtained after some steps are performed may be shown in a drawing.

It should be understood that in describing a structure of a device, in a case that a layer or region is described as being located on or "above" another layer or region, it is indicated that the layer or region is directly located on another layer or region, or that other layer or region exists between the layer or region and another layer or region. Further, if the device is flipped, the layer or region is located "below" or "under" another layer or region.

In order to illustrate a situation that a layer or region is directly located on another layer or region, the statement "A is directly located on B" or "A is located above B and is adjacent to B" is adopted herein. In the present disclosure, the statement "A is directly located in B" indicates a situation that A is located in B and A is directly adjacent to B, rather than a situation that A is located in a doped region formed in B.

Specific details of the present disclosure are described below, such as device structures, materials, dimensions, processes and techniques, so as to understand the present disclosure more clearly. The present disclosure may be implemented without the specific details, as those skilled in the art can understand.

An optical sensing assembly is provided in the present disclosure. The optical sensing assembly includes: a light emitting element, a first structure encapsulating the light emitting element, a light sensing element, and a second structure encapsulating the light sensing element. A light emitting surface is provided on a surface of the first structure. A light receiving surface is provided on a surface of the second structure. A light is emitted by the light emitting element to outside of the optical sensing assembly via the light emitting surface and is reflected by a to-be-detected object. The light reflected by the to-be-detected object is received by the light sensing element via the light receiving surface. The light sensing element is configured to perform distance sensing on the to-be-detected object based on the received reflected light. The light emitting surface is not parallel to the light receiving surface.

Figure 2A:
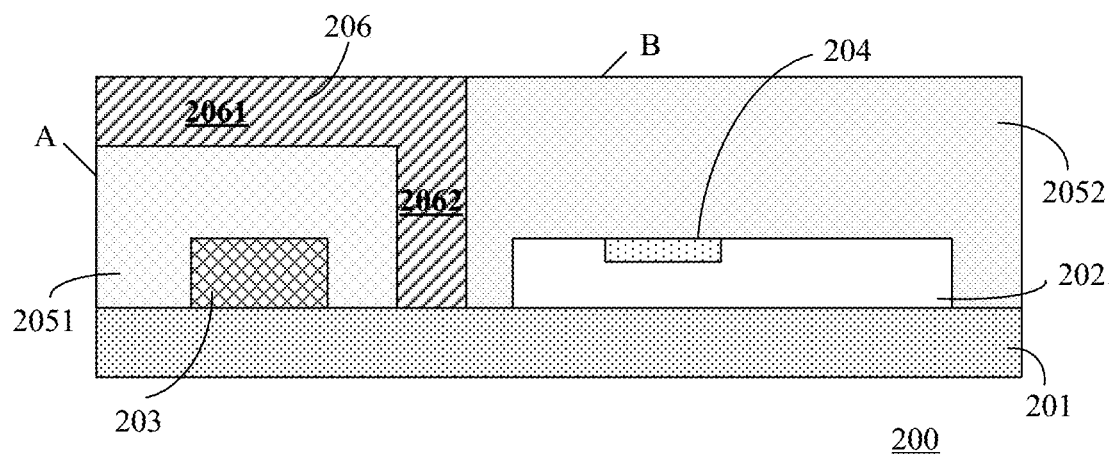
FIG. 2a and FIG. 2b respectively show a sectional view and a top view of an optical sensing assembly according to a first embodiment of the present disclosure.
Figure 2B:
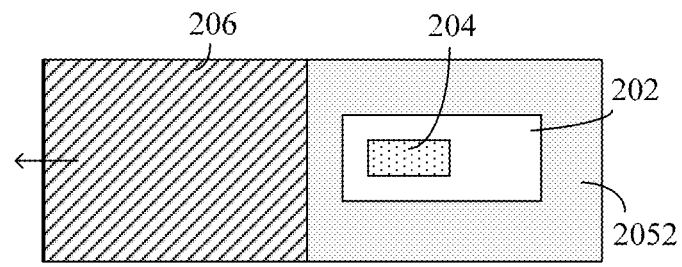

FIG. 2a and FIG. 2b respectively show a sectional view and a top view of an optical sensing assembly according to a first embodiment of the present disclosure. An optical sensing assembly 200 includes a light emitting element for emitting light as a light source and a light sensing element for detecting light reflected by an object. The light emitting element and the light sensing element may be, for example, integrated in a same encapsulating assembly. As shown in FIG. 2a, the optical sensing assembly 200 includes: a light emitting element 203, a first structure encapsulating the light emitting element, a light sensing element 202, and a second structure encapsulating the light sensing element. A light emitting surface A is provided on a surface of the first structure, and a light receiving surface B is provided on a surface of the second structure. The light emitting surface A is not parallel to the light receiving surface B. A light is emitted by the light emitting element 203 to outside of the optical sensing assembly via the light emitting surface A and is reflected by a to-be-detected object. The light reflected by the to-be-detected object is received by the light sensing element 202 via the light receiving surface B. The light sensing element 202 is used to perform distance sensing on the to-be-detected object based on the received reflected light.

The optical sensing assembly 200 further includes a circuit substrate 201. The first structure and the second structure are arranged side by side on the circuit substrate 201. The light emitting element 203 and the light sensing element 202 are respectively located on a first region and a second region of the circuit substrate 201. The first structure is configured to cover the first region to encapsulate the light emitting element 203 together with the first region, and the second structure is configured to cover the second region to encapsulate the light emitting element 202 together with the second region. The circuit substrate 201 may be implemented by, for example, a printed circuit board, to support the first structure, the second structure, the light emitting element 203, and the light sensing element 202, and provide wiring lines for circuit interconnection and external electrical connection. The light emitting element 203 may be selected from, for example, a light emitting diode (LED), a laser diode (LD), or a vertical cavity surface emitting laser (VCSEL). The light sensing element 202 includes a light receiving element 204 and a photoelectric conversion circuit. The light receiving element 204 is used to receive the light reflected by the to-be-detected object. The photoelectric conversion circuit is used to convert the reflected light into an electrical signal to be outputted. The light receiving element 204 may be selected from, for example, a photodiode and a phototransistor. The light emitting element 203 and the light sensing element 202 may be provided as, for example, separate chips, and are secured to the circuit substrate 201 by using an adhesive, and the light emitting element 203 and the light sensing element 202 are connected to the wiring lines on the circuit substrate 201 by using bonding wires.

The light receiving surface B is located on a top surface of the second structure, and the top surface of the second structure is located above an active surface of the light sensing element 202. The light emitting surface A is located on at least one of other side surfaces of the first structure than a side surface of the first structure adjacent to the second structure. Side surfaces of the first structure are surfaces of the first structure adjacent to a top surface of the first structure, and the top surface of the first structure is located above an active surface of the light emitting element. Specifically, as shown in FIG. 2a, the first structure includes a first light shielding cover 206. The first light shielding cover 206 includes a first portion 2061 covering the top surface of the first structure and a second portion 2062 covering the side surface of the first structure adjacent to the second structure. The light emitting surface A is formed on one of the side surfaces of the first structure. The first structure further includes a first transparent body 2051 covering the light emitting element 203. The first light shielding cover 206 covers a part of surfaces of the first transparent body 2051. The second structure includes a second transparent body 2052 covering the light sensing element 202. The first light shielding cover 206 is made of, for example, metal or an insulating material, and is secured to the circuit substrate 201 by using an adhesive or a fastener. The first light shielding cover 206 is made of a white material, so as to reflect light emitted by a light source. Each of the first transparent body and the second transparent body may be implemented by, for example, a transparent colloid.

The light generated by the light emitting element 203 as a light source is emitted via the light emitting surface A and reaches a surface of an object. The light receiving element 204 receives light reflected by the object, and the reflected light is converted into an electrical signal by the photoelectric conversion circuit.

Different from the optical sensing assembly 100 in the conventional technology, the optical sensing assembly 200 has a light emitting opening on the side surface, that is, an angle θ is formed between the light emitting surface A and the light receiving surface B, where the angle θ is greater than or equal to 90 degrees. In this embodiment, the first light shielding cover 206 or the first transparent body 2051 is aligned with the circuit substrate 201 at a side, and the angle θ is equal to 90 degrees. In a case that the side of the first light shielding cover 206 or the first transparent body 2051 aligned with the circuit substrate 201 is inclined towards the light sensing element, that is, in a case that an angle α between a side of the first light shielding cover (or the first transparent body) away from the light sensing element and a horizontal direction of the circuit substrate 201 is less than 90 degrees, the angle θ is greater than 90 degrees. In addition, in a case that the angle θ is greater than 150 degrees, a light emitting direction of the light emitted via the light emitting surface is almost parallel to a normal direction of the light receiving surface of the light sensing element 202, which does not increase the distance between light emitted by the light emitting element and light received by the light sensing element, and does not decrease the optical crosstalk. Therefore, the angle θ between the light emitting surface A and the light receiving surface B preferably is not less than 90 degrees and not greater than 150 degrees.

Figure 3A:
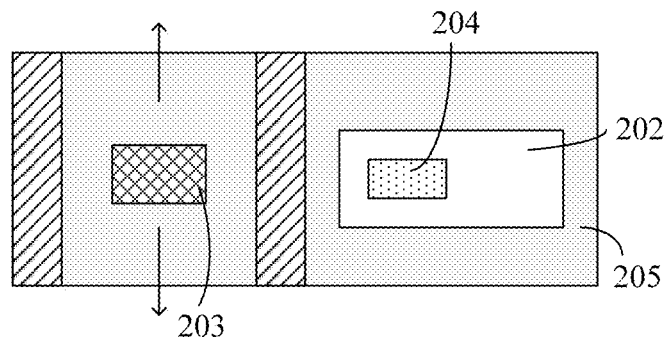
FIG. 3a to FIG. 3c respectively show top views of the optical sensing assembly in different light emitting directions.
Figure 3B:
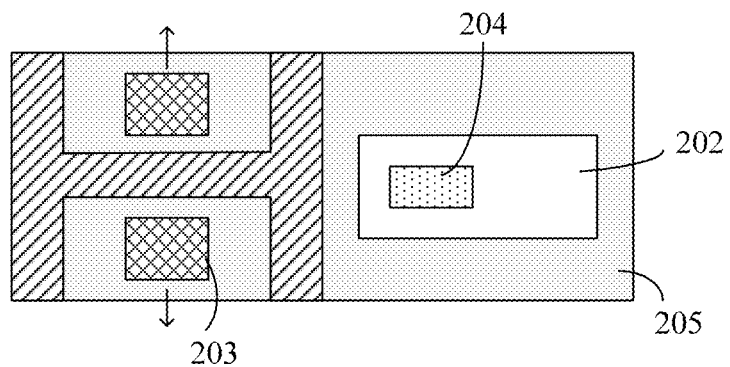
Figure 3C:
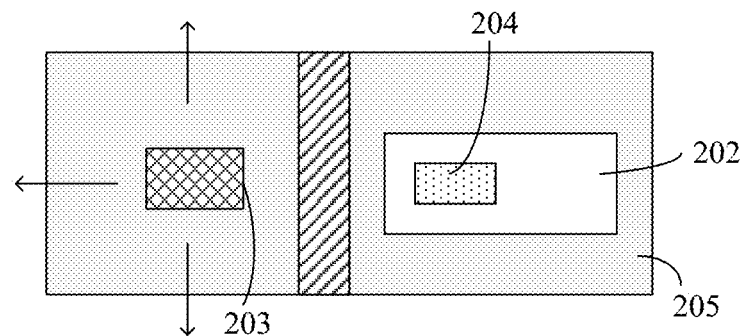

In this embodiment, the optical sensing assembly 200 has only one light emitting surface A. Light emitting surfaces in different directions may be provided according to different applications. FIG. 3a to FIG. 3c respectively show top views of the optical sensing assembly having different light emitting surfaces. In an actual top view, the light emitting element should be completely covered by a light shielding cover (as shown in FIG. 2b). In FIG. 3a to FIG. 3c, the light emitting element is exposed to more clearly illustrate the direction of the light emitting opening. According to the idea in the present disclosure of providing a light emitting surface on the side surface of the encapsulating body, the light emitting surface of the light emitting element may be provided on at least one of other three side surfaces of the light emitting element than the side surface of the light emitting element adjacent to the photoelectric conversion circuit. As shown in FIG. 3a and FIG. 3b, the number of light emitting surfaces of the optical sensing assembly is two, and directions of the two light emitting surfaces are opposite to each other. The number of light emitting elements shown in FIG. 3a is one, but the number of light emitting elements shown in FIG. 3b is two. As shown in FIG. 3c, the number of light emitting surfaces of the optical sensing assembly is three, that is, each of the three available side surfaces is provided with one light emitting surface. The number and the directions of the light emitting surfaces of the optical sensing assembly are not limited to the examples shown in FIG. 3a to FIG. 3c, and those skilled in the art may select an appropriate number and appropriate directions of the light emitting surfaces according to actual applications.

In addition, in this embodiment, at least one light emitting element 203 and at least one light sensing element 202 are encapsulated in an encapsulating body, where the encapsulating body includes the first structure and the second structure.

Figure 4:
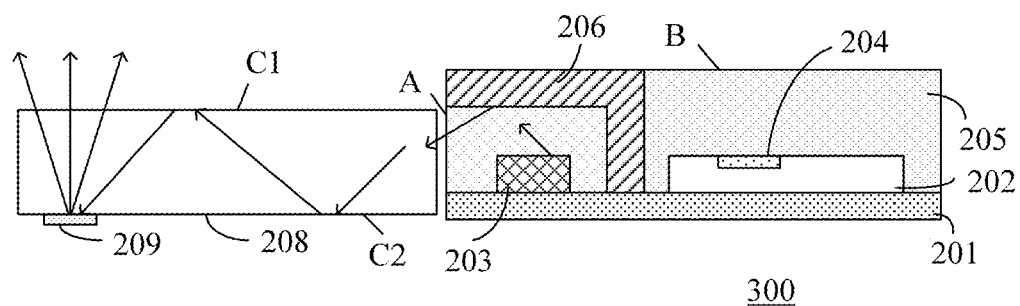
FIG. 4 is a sectional view of an optical sensing system according to the first embodiment of the present disclosure.

Reference is made to FIG. 4, which is a sectional view of an optical sensing system according to the first embodiment of the present disclosure. An optical sensing system 300 includes the optical sensing assembly 200 shown in FIG. 2a and FIG. 2b, and a light guide assembly 208. The light guide assembly 208 is arranged adjacent to the light emitting surface A of the optical sensing assembly 200. A light emitted via the light emitting surface A is transmitted to the light guide assembly 208 and extended by the light guide assembly 208, then emitted from a first surface C1 of the light guide assembly 208 and finally reflected by the to-bedetected object. The first surface C1 of the light guide assembly 208 is parallel to the light receiving surface B of the optical sensing assembly. The light guide assembly 208 further includes a second surface C2 opposite to the first surface C1. A light guide structure 209 is provided on the second surface C2 to guide the light entering in the light guide assembly 208 to be emitted from the first surface C1. In this way, the light can reach the surface of the object, and is reflected by the object. The reflected light is received by the light sensing element 202, and an electrical signal is generated.

Those skilled in the art may adjust the distance between the light transmitted to the first surface of the light guide assembly 208 and the light received by the light sensing element 202 by changing a length of a light guide plate. The structure for extending the light in this embodiment is not limited to the light guide assembly provided in the present disclosure, and other structures having the same extension effect may also be used. In addition, the light guide structure for transmitting the light to the first surface in the present disclosure may be implemented by, for example, a micro structure, or a diffusion material such as ink.

In this embodiment, the light emitted by the light emitting element 203 is emitted out via the light emitting surface A on a sidewall of the first structure, extends along the light guide assembly 208, and is transmitted to the first surface of the light guide assembly 208, so that a distance between the light emitted from the first surface C1 and the light received by the light sensing element 202 is increased, and the distance is not decreased with the size reduction of the optical sensing assembly 200, thereby decreasing the optical crosstalk caused due to the small-size optical sensing assembly, and improving the distance detection accuracy. The light guide assembly can be used to extend the distance for different applications in a system, so that the light guide assembly can be shared, and the cost of the encapsulating material can be greatly reduced.

In addition, the conventional light shielding cover is made of a black material to limit the propagating direction of the light by absorbing the light. The white light shielding cover in this embodiment has a reflection capability to change the propagating direction of the light, leading to a small loss of the light energy, thereby greatly reducing a driving current of the light emitting element.

Figure 5:
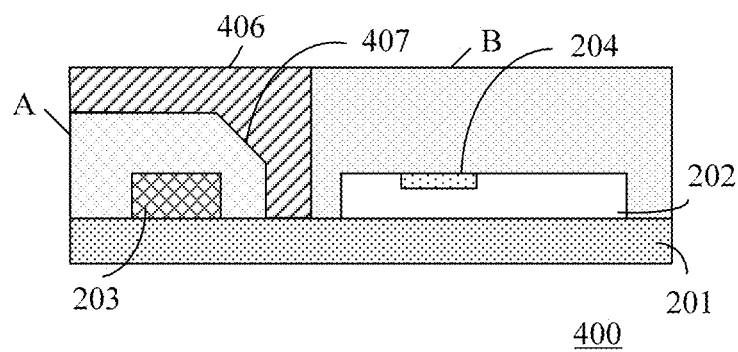
FIG. 5 is a sectional view of an optical sensing assembly according to a second embodiment of the present disclosure.

FIG. 5 is a sectional view of an optical sensing assembly according to a second embodiment of the present disclosure. The optical sensing assembly includes a light emitting element for emitting light as a light source and a light sensing element for detecting light reflected by an object. The light emitting element and the light sensing element may be, for example, integrated in a same encapsulating body. This embodiment differs from the first embodiment in that an inclined surface structure 407 is formed at a section of an inner surface of a first portion of a first light shielding cover 406 intersecting an inner surface of a second portion of the first light shielding cover 406, where the inner surface of the first light shielding cover 406 is a surface of the first light shielding cover 406 close to the light emitting element 203. With the inclined surface structure 407, the light emitted by the light source can be effectively reflected, thereby improving the light emitting efficiency of the light emitting element. Further, a curved surface structure or other structures by which the light emitted by the light source can be effectively reflected may be formed at the section of the inner surface of the first portion of the first light shielding cover 406 intersecting the inner surface of the second portion of the first light shielding cover 406, to improve the light emitting efficiency of the light emitting element. Other structures in this embodiment are the same as those in the first embodiment, which are not repeated herein.

Compared with the first embodiment, in the optical sensing assembly 400 according to the second embodiment of the present disclosure, the structure of the inner surface of the light shielding cover is modified, so that the light emitted by the light source can be more effectively reflected to the light emitting opening, thereby increasing the light emitting efficiency of the light emitting element, and improving the distance detection accuracy.

Figure 6:
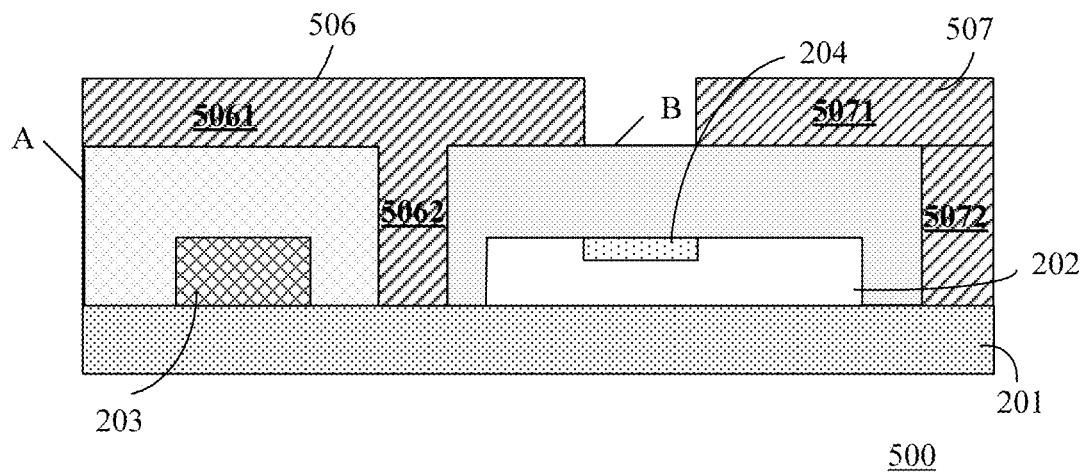
FIG. 6 is a sectional view of an optical sensing assembly according to a third embodiment of the present disclosure.

FIG. 6 is a sectional view of an optical sensing assembly according to a third embodiment of the present disclosure. The optical sensing assembly includes a light emitting element for emitting light as a light source and a light sensing element for detecting light reflected by an object. The light emitting element and the light sensing element may be, for example, integrated in a same encapsulating body. This embodiment differs from the first embodiment in that a first portion 5061 of a first light shielding cover 506 extends to a part of the top surface of the second structure and the second structure includes a second light shielding cover 507. The second light shielding cover 507 includes a first portion 5071 covering a part of the top surface of the second structure and a second portion 5072 covering at least a part of side surfaces of the second structure, and the light receiving surface B is located in a region formed between the first portion 5061 of the first light shielding cover 506 and the first portion 5071 of the second light shielding cover 507. In the optical sensing assembly 500 according to the third embodiment of the present disclosure, by decreasing the area of the light receiving surface, the optical crosstalk caused due to partial light transmission of the first light shielding cover 506 can be decreased, thereby improving the distance detection accuracy. Other structures in this embodiment are the same as those in the first embodiment, which are not repeated herein.

Figure 7A:
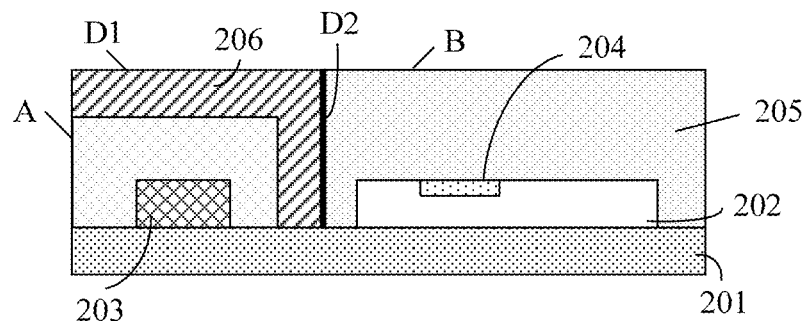
FIG. 7a and FIG. 7b respectively show sectional views of an optical sensing assembly according to a fourth embodiment of the present disclosure.
Figure 7B:
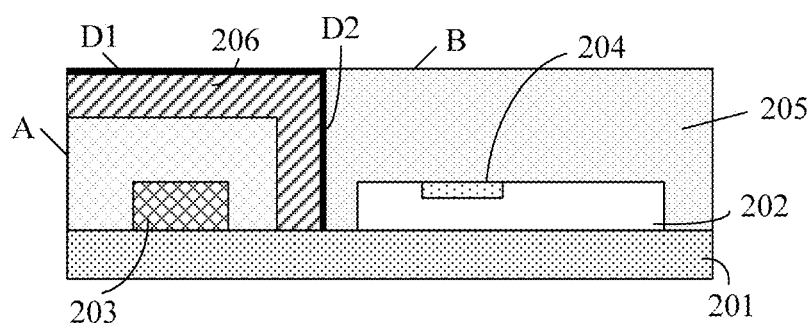

FIG. 7a and FIG. 7b respectively show sectional views of an optical sensing assembly according to a fourth embodiment of the present disclosure. The optical sensing assembly includes a light emitting element for emitting light as a light source and a light sensing element for detecting light reflected by an object. The light emitting element and the light sensing element may be, for example, integrated in a same encapsulating body. This embodiment differs from the first embodiment in that a light blocking layer is arranged on at least one of an outer surface D2 of the second portion of the first light shielding cover 206 and an outer surface D1 of the first portion of the first light shielding cover 206, where the outer surface D2 of the second portion of the first light shielding cover 206 is a surface of the second portion of the first light shielding cover 206 adjacent to the second structure, and the outer surface D1 of the first portion of the first light shielding cover 206 is the top surface of the first structure. Other structures in this embodiment are the same as those in the first embodiment, which are not repeated herein.

In an embodiment, as shown in FIG. 7a, the outer surface D2 of the second portion of the first light shielding cover 206 is painted black to decrease the optical crosstalk caused due to light transmission. In another embodiment, as shown in FIG. 7b, the outer surface D2 of the second portion of the first light shielding cover 206 and the outer surface D1 of the first portion of the first light shielding cover 206 are painted black to further decrease the optical crosstalk caused due to light transmission, so as to improve the distance detection accuracy.

A method for manufacturing an optical sensing assembly is further provided in the present disclosure. The method includes:

encapsulating a light emitting element 203 in a first structure, where a light emitting surface A is provided on a surface of the first structure; and encapsulating a light sensing element 202 in a second structure, where a light receiving surface B is provided on a surface of the second structure.

A light is emitted by the light emitting element to outside of the optical sensing assembly via the light emitting surface and is reflected by a to-be-detected object.

The light reflected by the to-be-detected object is received by the light sensing element via the light receiving surface, and the light sensing element is configured to perform distance sensing on the to-be-detected object based on the received reflected light.

The light emitting surface is arranged in nonparallel to the light receiving surface.

Further, the method further includes:

arranging the first structure and the second structure side by side;

arranging the light receiving surface on a top surface of the second structure, where the top surface of the second structure is located above an active surface of the light sensing element; and arranging the light emitting surface on at least one of other side surfaces of the first structure than a side surface of the first structure adjacent to the second structure, where side surfaces of the first structure are surfaces of the first structure adjacent to a top surface of the first structure, and the top surface of the first structure is located above an active surface of the light emitting element.

Further, the method further includes: arranging at least one light emitting element and at least one light sensing element in an encapsulating body, where the encapsulating body includes the first structure and the second structure.

Further, the step of arranging at least one light emitting element and at least one light sensing element in an encapsulating body includes:

providing a circuit substrate;

installing the at least one light emitting element in a first region of the circuit substrate in a manner in which the active surface of the light emitting element faces up, and installing the at least one light sensing element in a second region of the circuit substrate in a manner in which the active surface of the light sensing element faces up;

covering the first region with the first structure; and covering the second region with the second structure.

Further, the step of covering the first region with the first structure and covering the second region with the second structure includes:

providing a first light shielding cover for the light emitting element on the circuit substrate, where the first light shielding cover includes: a first portion located above the active surface of the light emitting element, and a second portion located between the first region and the second region and connected with the first portion; and filling a space between the first light shielding cover and the light emitting element with a transparent encapsulant, to form a first transparent body covering the light emitting element and a second transparent body covering the light sensing element, where the first structure includes the first light shielding cover and the first transparent body, and the second structure includes the second transparent body.

Further, the method further includes: forming an inclined surface or a curved surface at a section of an inner surface of the first portion of the first light shielding cover intersecting an inner surface of the second portion of the first light shielding cover, where the inner surface of the first light shielding cover is a surface of the first light shielding cover close to the light emitting element.

Further, the method further includes: painting at least one of an outer surface of the second portion of the first light shielding cover and an outer surface of the first portion of the first light shielding cover black, where the outer surface of the second portion of the first light shielding cover is a surface of the second portion of the first light shielding cover adjacent to the second structure.

There are provided an optical sensing assembly, a method for manufacturing an optical sensing assembly, and an optical sensing system in the present disclosure. In the optical sensing assembly, the light emitting surface of the light emitting element is arranged in nonparallel to the light receiving surface of the light sensing element. Further, the optical sensing system is formed by the optical sensing assembly and the light guide assembly. Therefore, the distance between light emitted by the light emitting element to the to-be-detected object and light received by the light sensing element is increased, so that the optical crosstalk can be greatly decreased even if the optical sensing assembly has a small size, thereby improving the distance detection accuracy.

It should be noted that the relationship terminologies herein such as "first" and "second" are only used to distinguish one entity or operation from another entity or operation, rather than necessitating or implying an actual relationship or order between the entities or operations. Moreover, terms such as "comprise", "include", or any other variant thereof are intended to be non-exclusive. Therefore, a process, a method, an article, or a device including a series of elements includes not only the elements but also other elements that are not enumerated, or further includes the elements inherent for the process, the method, the article, or the device. Unless expressively limited otherwise, an element defined by the statement "comprising (including) a . . . " does not exclude the case that the process, the method, the article or the device including the element may include other similar elements.

Embodiments in the present disclosure are described above, and not all details are described in detail in the embodiments. The present disclosure is not limited to the specific embodiments. It is apparent that various modifications and variations may be made based on the above description. The embodiments are selected and described in detail in this specification, to explain the principles and practical applications of the present disclosure, so that those skilled in the art can make good use of the present disclosure and the modifications based on the present disclosure. The present disclosure is limited only by the claims and the full scope and equivalents thereof.

The invention claimed is:

1. An optical sensing assembly, comprising:
   a light emitting element;
   a first structure encapsulating the light emitting element, wherein only one light emitting surface or two or more light emitting surfaces are provided on the first structure;
   a light sensing element; and
   a second structure encapsulating the light sensing element, wherein a light receiving surface is provided on a surface of the second structure, wherein a light is emitted by the light emitting element to outside of the optical sensing assembly via the light emitting surface and is reflected by a to-be-detected object;

the light reflected by the to-be-detected object is received by the light sensing element via the light receiving surface, the light sensing element is configured to perform distance sensing on the to-be-detected object based on the received reflected light; and in a case that only one light emitting surface is provided, the only one light emitting surface is nonparallel to the light receiving surface, and in a case that two or more light emitting surfaces are provided, the two or more light emitting surfaces are both or all nonparallel to the light receiving surface, wherein the first structure and the second structure are arranged side by side, the light receiving surface is located on a top surface of the second structure, and the top surface of the second structure is located above an active surface of the light sensing element; and the light emitting surface is located on at least one of other side surfaces of the first structure than a side surface of the first structure adjacent to the second structure, side surfaces of the first structure are surfaces of the first structure adjacent to a top surface of the first structure, and the top surface of the first structure is located above an active surface of the light emitting element.

2. The optical sensing assembly according to claim 1, wherein the first structure comprises a first light shielding cover, and the first light shielding cover comprises a first portion covering the top surface of the first structure and a second portion covering the side surface of the first structure adjacent to the second structure.

3. The optical sensing assembly according to claim 2, wherein an inclined surface or a curved surface is formed at a section of an inner surface of the first portion of the first light shielding cover intersecting an inner surface of the second portion of the first light shielding cover, and the inner surface of the first light shielding cover is a surface of the first light shielding cover close to the light emitting element.

4. The optical sensing assembly according to claim 2, wherein a light blocking layer is arranged on at least one of an outer surface of the second portion of the first light shielding cover and an outer surface of the first portion of the first light shielding cover, the outer surface of the second portion of the first light shielding cover is a surface of the second portion of the first light shielding cover adjacent to the second structure.

5. The optical sensing assembly according to claim 4, wherein at least one of the outer surface of the second portion of the first light shielding cover and the outer surface of the first portion of the first light shielding cover is painted black.

6. The optical sensing assembly according to claim 2, wherein the first portion of the first light shielding cover extends to a part of the top surface of the second structure.

7. The optical sensing assembly according to claim 6, wherein the second structure comprises a second light shielding cover, the second light shielding cover covers a part of the top surface of the second structure and at least a part of side surfaces of the second structure, with the light receiving surface being located in a region formed between the first portion of the first light shielding cover and the second light shielding cover.

8. The optical sensing assembly according to claim 2, wherein the first light shielding cover is configured to reflect the light emitted by the light emitting element.

9. The optical sensing assembly according to claim 1, wherein an angle between the light emitting surface and the light receiving surface is greater than or equal to 90 degrees.

10. The optical sensing assembly according to claim 1, further comprising:
a circuit substrate, wherein
the light emitting element and the light sensing element are respectively located on a first region and a second region of the circuit substrate;
the first structure covers the first region to encapsulate the light emitting element together with the first region; and
the second structure covers the second region to encapsulate the light sensing element together with the second region.

11. An optical sensing system, comprising:
the optical sensing assembly according to claim 1; and
a light guide assembly arranged adjacent to the light emitting surface of the optical sensing assembly, wherein
a light is transmitted to the light guide assembly via the light emitting surface, and the light transmitted to the light guide assembly is transmitted to the to-be-detected object via a first surface of the light guide assembly and is reflected by the to-be-detected object; and
the first surface is parallel to the light receiving surface.

12. The optical sensing system according to claim 11, wherein the light guide assembly further comprises:
a second surface opposite to the first surface, wherein a light guide structure is provided on the second surface to guide the light entering in the light guide assembly to be emitted from the first surface.

13. The optical sensing system according to claim 12, wherein the light guide structure is made of a diffusion material adhered to the second surface of the light guide assembly.

14. A method for manufacturing an optical sensing assembly, comprising:
encapsulating a light emitting element in a first structure, wherein only one light emitting surface or two or more light emitting surfaces are provided on the first structure;
encapsulating a light sensing element in a second structure, wherein a light receiving surface is provided on a surface of the second structure;
arranging the first structure and the second structure side by side;
arranging the light receiving surface on a top surface of the second structure, wherein the top surface of the second structure is located above an active surface of the light sensing element; and
arranging the light emitting surface on at least one of other side surfaces of the first structure than a side surface of the first structure adjacent to the second structure, wherein side surfaces of the first structure are surfaces of the first structure adjacent to a top surface of the first structure, and the top surface of the first structure is located above an active surface of the light emitting element, wherein
a light is emitted by the light emitting element to outside of the optical sensing assembly via the light emitting surface and is reflected by a to-be-detected object,
the light reflected by the to-be-detected object is received by the light sensing element via the light receiving surface, and the light sensing element is configured to perform distance sensing on the to-be-detected object based on the received reflected light; and in a case that only one light emitting surface is provided, the only one light emitting surface is arranged in nonparallel to the light receiving surface, and in a case that two or more light emitting surfaces are provided, the two or more light emitting surfaces are both or all arranged in nonparallel to the light receiving surface.

15. The method according to claim 14, further comprising:

arranging at least one light emitting element and at least one light sensing element in an encapsulating member, wherein the encapsulating member comprises the first structure and the second structure.

16. The method according to claim 15, wherein the step of arranging at least one light emitting element and at least one light sensing element in an encapsulating body comprises:

providing a circuit substrate;

installing the at least one light emitting element in a first region of the circuit substrate in a manner in which the active surface of the light emitting element faces up, and installing the at least one light sensing element in a second region of the circuit substrate in a manner in which the active surface of the light sensing element faces up; and covering the first region with the first structure and covering the second region with the second structure.

17. The method according to claim 16, wherein the step of covering the first region with the first structure and covering the second region with the second structure comprises:

providing a first light shielding cover for the light emitting element on the circuit substrate, wherein the first light shielding cover comprises a first portion located above the active surface of the light emitting element, and a second portion located between the first region and the second region and connected with the first portion; and filling a space between the first light shielding cover and the light emitting element with a transparent encapsulant to form a first transparent body covering the light emitting element and a second transparent body covering the light sensing element, wherein the first structure comprises the first light shielding cover and the first transparent body, and the second structure comprises the second transparent body.

18. The method according to claim 17, further comprising:

forming an inclined surface or a curved surface at a section of an inner surface of the first portion of the first light shielding cover intersecting an inner surface of the second portion of the first light shielding cover, wherein the inner surface of the first light shielding cover is a surface of the first light shielding cover close to the light emitting element.

19. The method according to claim 17, further comprising:

painting at least one of an outer surface of the second portion of the first light shielding cover and an outer surface of the first portion of the first light shielding cover black, wherein the outer surface of the second portion of the first light shielding cover is a surface of the second portion of the first light shielding cover adjacent to the second structure.

* * * * *